United States Patent
Cheng et al.

(10) Patent No.: US 9,362,385 B2
(45) Date of Patent: Jun. 7, 2016

(54) METHOD FOR TUNING THRESHOLD VOLTAGE OF SEMICONDUCTOR DEVICE WITH METAL GATE STRUCTURE

(71) Applicant: TAIWAN SEMICONDUCTOR MANUFACTURING COMPANY LTD., Hsinchu (TW)

(72) Inventors: Chung-Liang Cheng, Changhua County (TW); Yen-Yu Chen, Taichung (TW); Wei-Jen Chen, Taichung (TW); Chang-Sheng Lee, Shin-Chu (TW); Wei Zhang, Chupei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/132,901

(22) Filed: Dec. 18, 2013

(65) Prior Publication Data
US 2015/0171177 A1   Jun. 18, 2015

(51) Int. Cl.
*H01L 21/316* (2006.01)
*H01L 29/66* (2006.01)
*H01L 29/06* (2006.01)

(52) U.S. Cl.
CPC .... *H01L 29/66795* (2013.01); *H01L 29/66545* (2013.01); *H01L 29/0673* (2013.01)

(58) Field of Classification Search
CPC .................................................. H01L 29/4966
See application file for complete search history.

(56) References Cited

U.S. PATENT DOCUMENTS

| | | | |
|---|---|---|---|
| 2011/0151122 A1* | 6/2011 | Kato et al. | 427/255.23 |
| 2011/0298062 A1 | 12/2011 | Ganguli et al. | |
| 2012/0223397 A1 | 9/2012 | Yang et al. | |
| 2013/0115383 A1* | 5/2013 | Lu et al. | 427/535 |
| 2013/0299918 A1* | 11/2013 | Kim et al. | 257/402 |

FOREIGN PATENT DOCUMENTS

| | | |
|---|---|---|
| KR | 10-2013-0087482 A | 8/2013 |
| KR | 10-2013-0126313 A | 11/2013 |

OTHER PUBLICATIONS

Veloso et al., "Effective Work Function Engineering for Aggressively Scaled Planar and Multi-Gate Fin Field-Effect Transistor-Based Devices with High-k Last Replacement Metal Gate Technology," Jpn. J. Appl. Phys. 52 04CA02 (2013); doi:10.7567/JJAP.52.04CA02.*
Heo et al., "Plasma atomic layer deposited TiN metal gate for three dimensional device applications: Deposition temperature, capping metal and post annealing," Microelec. Eng., vol. 94, Jun. 2012, pp. 11-13, ISSN 0167-9317; doi:10.1016/j.mee.2011.12.001.*
Official action issued by Taiwan intellectual Property Office on Sep. 17, 2015.
Office Action issued by Korean Intellectual Property Office on Mar. 2, 2016.

* cited by examiner

*Primary Examiner* — Peniel M Gumedzoe
*Assistant Examiner* — Christopher Johnson
(74) *Attorney, Agent, or Firm* — Chun-Ming Shih

(57) ABSTRACT

A method for manufacturing a metal gate structure includes forming a high-k dielectric layer in a gate trench; forming an etch stop over the high-k dielectric layer; forming a work function adjusting layer over the etch stop by forming a tri-layer by an atomic layer deposition (ALD) operation with a sequence of a grain boundary engineering layer configured to allow a dopant atom to penetrate there through, a doping layer configured to provide the dopant atom to the grain boundary engineering layer, and a capping layer configured to prevent the doping layer from oxidation; and filling metal to level up the gate trench. The grain boundary engineering layer is prepared by the ALD operation under various temperatures such as from about 200 to about 350 degrees Celsius.

20 Claims, 18 Drawing Sheets

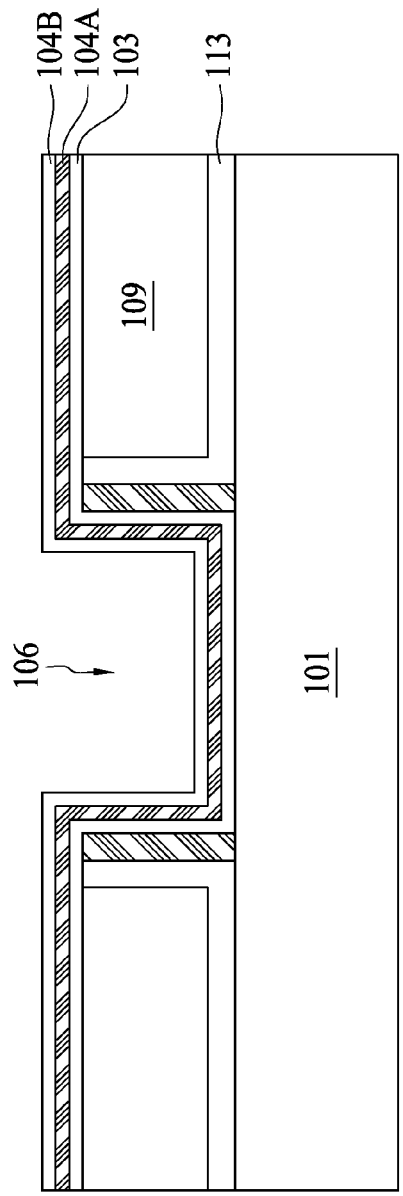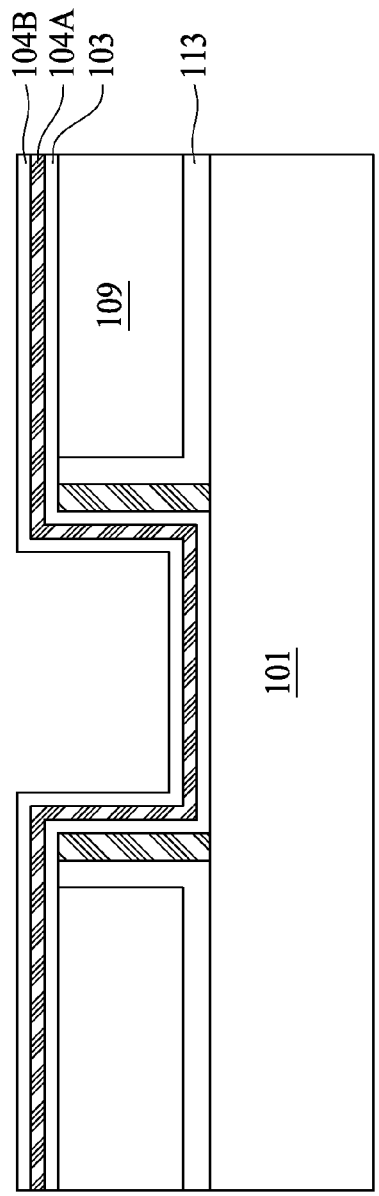

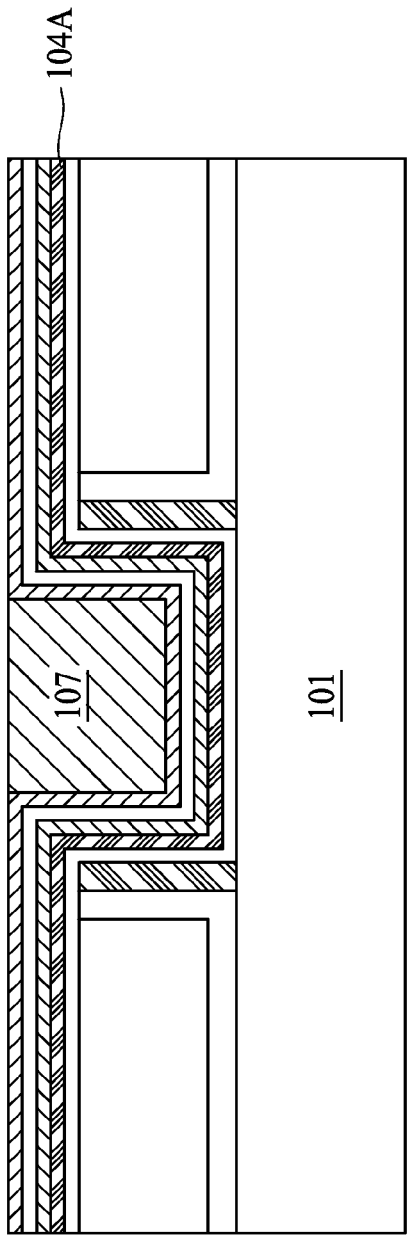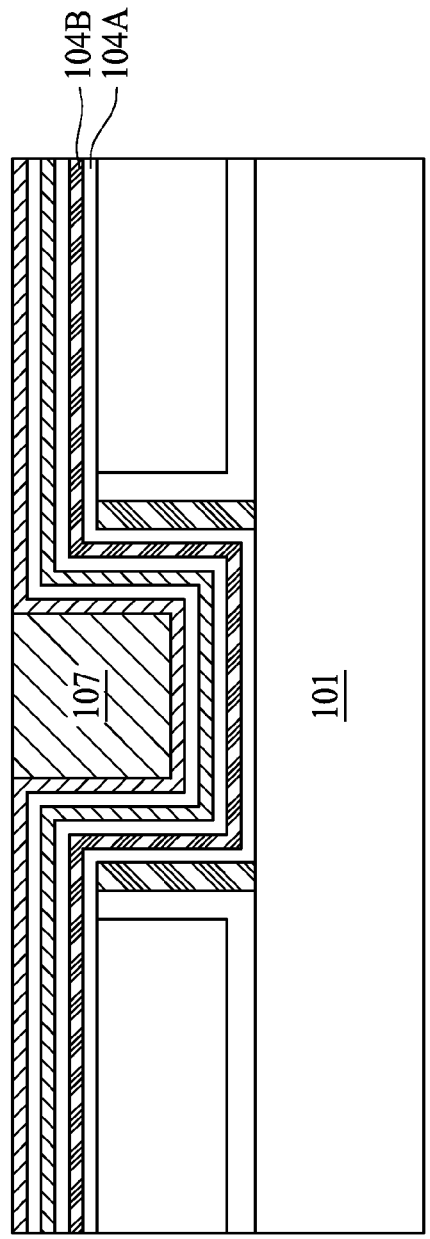

METHOD FOR TUNING THRESHOLD VOLTAGE OF SEMICONDUCTOR DEVICE WITH METAL GATE STRUCTURE

FIELD

The disclosure relates to a metal gate in a semiconductor structure.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. As the dimensions of transistors decrease, the thickness of the gate oxide must be reduced to maintain performance with the decreased gate length. However, in order to reduce gate leakage, high dielectric constant (high-k) gate insulator layers are used which allow greater physical thicknesses while maintaining the same effective capacitance as would be provided by a typical gate oxide used in larger technology nodes.

Additionally, as technology nodes shrink, in some IC designs, there has been a desire to replace the typically polysilicon gate electrode with a metal gate (MG) electrode to improve device performance with the decreased feature sizes. One process of forming the MG electrode is termed "gate last" process, as opposed to another MG electrode formation process termed "gate first". The "gate last" process allows for reduced number of subsequent processes, including high temperature processing, that must be performed after formation of the gate.

Thus, what is desired is a method and semiconductor device providing differently configured metal gate structures for each of NMOS and PMOS transistors formed on a substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 6A, 7A, 8A, 9A, 10A are operations of a manufacturing method for a metal gate in a NFET structure in accordance with some embodiments of the present disclosure;

FIG. 6B, 7B, 8B, 9B, 10B are operations of a manufacturing method for a metal gate in a PFET structure in accordance with some embodiments of the present disclosure;

DETAILED DESCRIPTION OF THE INVENTION

Figure 1:
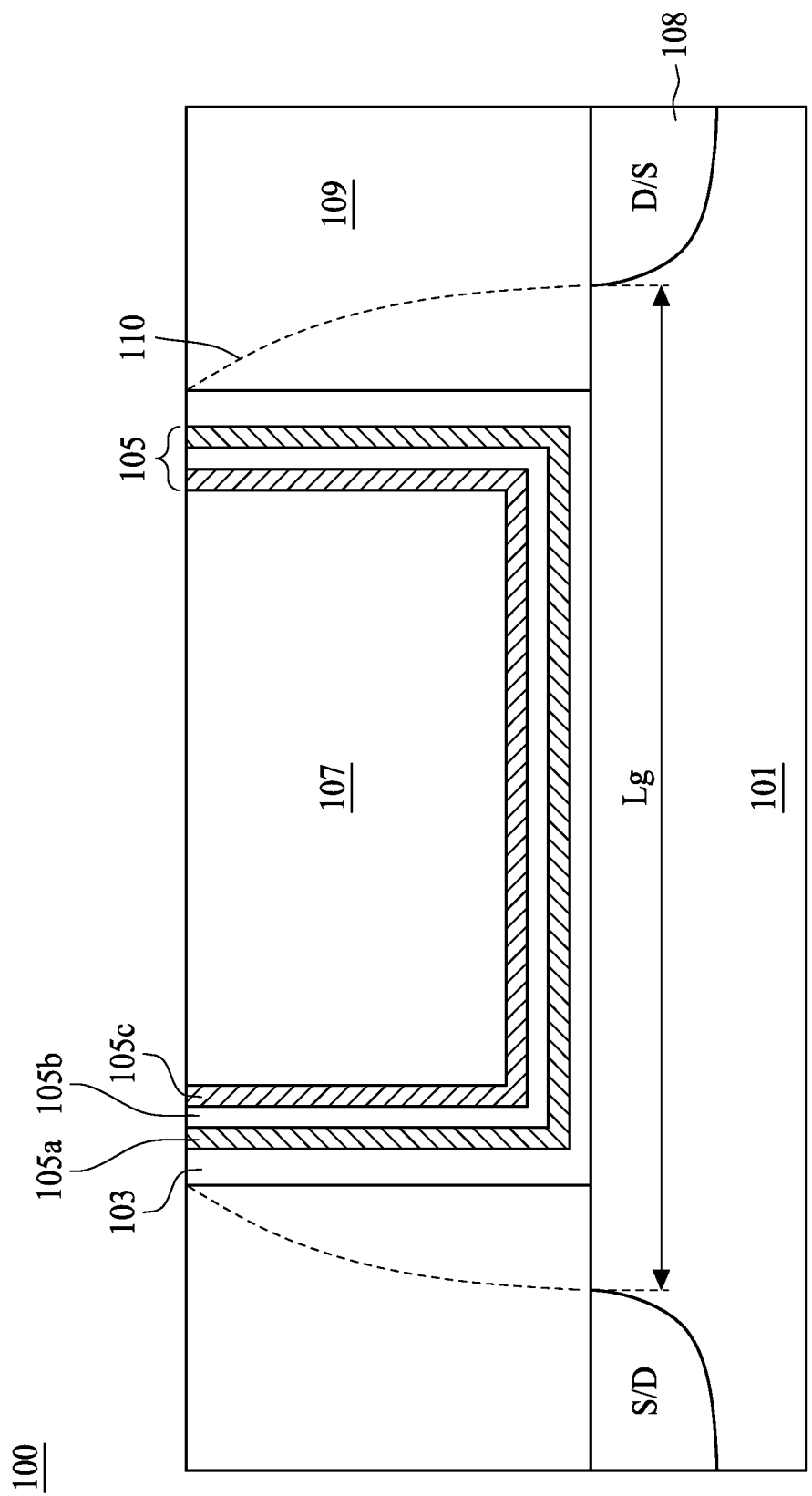
FIG. 1 is a cross sectional view of a metal gate of a semiconductor structure in accordance with some embodiments of the present disclosure.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. It is to be understood that the following disclosure provides many different embodiments or examples for implementing different features of various embodiments. Specific examples of components and arrangements are described below to simplify the present disclosure. These are, of course, merely examples and are not intended to be limiting.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Aluminum implantation is used to reduce the flatband voltage ($V_{FB}$) and the effective work function of a metal gate (MG) stack close to a channel region of a transistor. Metal elements such as aluminum have been used as a prominent vehicle to adjust a threshold voltage of an N-type transistor given its ability to attract negative carriers in the channel region of the N-type transistor and hence lower the threshold voltage. However, along with the shrinkage of device technology node, atomic layer deposition (ALD) is adopted as a means to directly deposit conductive thin film containing said metal elements.

During ALD operation, aluminum blister defects can be attributed to at least two issues: 1) the excessive aluminum precursor dosage, for example, too much dimethylaluminumhydride (DMAH) and/or dimethylethylaminealane (DMEAA), would induce self-reaction of the precursors and form aluminum agglomeration; and 2) a free electron-deficient underlayer which decreases the degree of absorption of the precursors. The free electron-deficient underlayer can be an oxide layer that is formed by an obstruction of vacuum status (i.e. a vacuum break) during a growth of a non aluminum-containing film. The oxide layer not only is short of free electrons but also blocking the diffusion channels to the aluminum ions from the overlaid layer. When the metal ion cannot reach to a position close to the channel region of the transistor, threshold voltage tuning capability is therefore limited.

In some embodiments of the present disclosure, a tri-layer structure and an in situ-ALD operation is introduced in forming a MG stack. To be more specific, the tri-layer structure described herein functions as a work function adjusting layer, or an N work function metal layer, and the in situ-ALD operation provides an ALD operation flow that no vacuum break is required during the course of the deposition.

The tri-layer structure discussed herein refers to (from bottom to top) a grain boundary engineering layer (GBEL), a doping layer containing aluminum, and an optional capping layer. In some embodiments, the GBEL allows a dopant atom to penetrate there through via diffusion channels such as grain boundaries. The doping layer situates over the GBEL and provides a dopant source to the GBEL. The optional capping layer is positioned over the doping layer, preventing the doping layer from being oxidized by an in-situ capping measure. By controlling the degree of dopant penetration in the GBEL, the threshold voltage of the transistor is adjustable. Moreover, by performing the growth of the tri-layer structure in an in-situ manner without vacuum break, no oxide layer is formed in the tri-layer structure.

Some embodiments of the present disclosure provide a tri-layer structure and an in situ ALD operation allows the tuning of the threshold voltage of a transistor not only dependent to the dosage of the precursors but also adjustable through the degree of dopant penetration of a GBEL. The aluminum blister defects in a MG stack can be alleviated due to an in situ film growth without an oxide layer formation.

Some embodiments of the present disclosure provide a metal gate MOSFET (MG-MOSFET). The MG-MOSFET includes a tri-layer structure and is manufactured in an in situ manner without vacuum break as discussed herein. Other embodiments of the present disclosure provide a metal gate FinFET (MG-FinFET). The MG-FinFET includes a tri-layer structure and is manufactured in an in situ manner without vacuum break as discussed herein.

Some embodiments of the present disclosure provide a method for manufacturing a NFET and a PFET of a MG-FinFET including a tri-layer structure. Other embodiments of the present disclosure provide a method for manufacturing a MG-FinFET including a tri-layer structure using a "gate last" operation.

FIG. 1 shows a cross sectional view of a metal gate 100 having a tri-layer structure. In some embodiments, a semiconductor device having the metal gate 100 is a NMOS. A tri-layer structure or a work function adjusting layer 105, and a metal layer 107 filling a trench formed by the work function adjusting layer 105 are collectively called a metal gate stack (105, 107). In FIG. 1, the metal gate stack (105, 107) is positioned over a semiconductor substrate 101, and a high-k dielectric layer 103 is lined between the semiconductor substrate 101 and a bottom of the metal gate stack (105, 107). An optional spacer 110 is situated at a sidewall of the metal gate stack (105, 107) to facilitate the subsequent source/drain alignment operation. The high-k dielectric layer 103 is lined between the metal gate stack (105, 107) and the optional spacer 110.

As shown in FIG. 1, the metal gate stack (105, 107), the high-k dielectric layer 103, and the optional spacer 110 are positioned between an interlayer dielectric (ILD) 109 in a lateral direction. In FIG. 1, a source or a drain (S/D) 108 is defined in the semiconductor substrate 101, and a distance between the source and the drain is a gate length $L_g$. In some embodiments, the gate length $L_g$ of an NMOS is about 16 nm. In other embodiments, the gate length $L_g$ of an NMOS is less than 16 nm.

A tri-layer structure is shown in the work function adjusting layer 105 of the metal gate stack (105, 107). In some embodiments, the tri-layer structure functions as an N work function metal layer. In some embodiments, the tri-layer structure includes a grain boundary engineering layer (GBEL) 105a, a doping layer 105b, and a capping layer 105c. The GBEL is the outer-most layer of the metal gate stack (105, 107), interfacing with the high-k dielectric layer 103. The doping layer 105b conforms to the profile of the GBEL 105a and is sandwiched between the GBEL 105a and the capping layer 105c.

In some embodiments of the present disclosure, the semiconductor substrate 101 referred herein is a bulk semiconductor substrate on which various layers and device structure are formed. In some embodiments, the bulk substrate includes silicon or a compound semiconductor, such as GaAs, InP, Si/Ge, or SiC. Various layers can be formed on the semiconductor substrate 101. For example, dielectric layers, doped layers, polysilicon layers or conductive layers. Various devices can be formed on the semiconductor substrate 101. For example, transistors, resistors, and/or capacitors, which may be interconnected through an interconnect layer to additional integrated circuits.

In some embodiments of the present disclosure, the high-k dielectric layer 103 is formed by ALD, CVD, metalorganic CVD (MOCVD), PVD, plasma enhanced CVD (PECVD), plasma enhance ALD (PEALD), thermal oxidation, combinations thereof, or other suitable technique. In some embodiments, the high-k dielectric layer 103 includes a thickness ranging from about 5 to about 30 Å. The high-k dielectric layer 103 includes a binary or ternary high-k film such as $HfO_x$. In some embodiments, the high-k dielectric layer 103 includes other high-k dielectrics such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides, or other suitable materials.

In some embodiments of the present disclosure, the GBEL 105a includes TiN or TaN having a thickness ranging from about 10 Å to about 30 Å. The GBEL 105a allows dopant atoms injecting from a doping layer 105b to penetrate there through by means of diffusion. The GBEL 105a is formed by various deposition techniques such as ALD, PVD, CVD, PECVD, or other suitable techniques under a substrate temperature of from about 200 to about 350 degrees Celsius.

In some embodiments, a film thickness of the GBEL 105a is determined by a closure status of the film. The term "closure film" used herein refers to a complete coverage status for an underlayer achieved by thin film growth. For example, when an ALD growth condition induces an island growth mechanism, a closure film can be obtained after about 30 cycles. In some embodiments, the closure film obtained has a thickness of about 15 Å to about 20 Å. In some embodiments, the GBEL 105a (at the same time a closure film) has a crystalline structure where defined grain boundaries can be identified under an electron microscope observation. In other embodiments, GBEL 105a (at the same time a closure film) has an amorphous structure where no defined grain boundaries can be identified.

In some embodiments of the present disclosure where a crystalline structure is identified in a GBEL 105a, various degree of crystallinity can be identified by an X-ray Diffraction (XRD) performed on the GBEL 105a. For example, a GBEL which is grown by an ALD operation under a substrate temperature of about 275 degrees Celsius has twice a (111) peak intensity in an XRD 2-theta scan than the GBEL layer grown at about 225 degrees Celsius. For another example, the GBEL which is grown by an ALD operation under a substrate temperature of about 325 degrees Celsius has three times a (111) peak intensity in an XRD 2-theta scan than the GBEL layer grown at about 225 degrees Celsius. It is shown that the GBEL grown at a higher temperature about 325 degrees Celsius has a better crystallinity compared to the GBEL grown at a lower temperature about 225 degrees Celsius.

In some embodiments of the present disclosure, the doping layer 105b includes $TiAl_x$ with a thickness of from about 20 Å to about 50 Å. In some embodiments, an ALD operation with aluminum precursor dimethylaluminumhydride (DMAH) or dimethylethylaminealane (DMEAA) is used to form the doping layer 105b.

Referring to FIG. 1, the doping layer 105b is positioned on top of the GBEL 105a. The doping layer 105b is configured to provide dopants, in some embodiments, aluminum ions, to the GBEL 105a. In the case where the crystallinity and the grain boundary density of the GBEL 105a is relatively high (for example, a GBEL ALD-grown at about 325 degrees Celsius), the quantity of dopants penetrating from the doping layer 105b to the GBEL 105a is greater than the case where the crystallinity and the grain boundary density of the GBEL 105a is relatively low (for example, a GBEL ALD-grown at about 225 degrees Celsius). The more the dopants accumulated at the GBEL 105a, the lower the threshold voltage of a transistor. In other words, the microstructure of the GBEL 105a is tailored to meet different threshold voltage requirement.

In some embodiments of the present disclosure, the capping layer 105c includes TiN or TaN having a thickness ranging from about 10 Å to about 25 Å. The capping layer 105c is formed on top of the doping layer 105b in an in situ manner (i.e. without vacuum break), preventing the doping layer 105b from being oxidized. The capping layer 105c is formed by various deposition techniques such as ALD, PVD, CVD, PECVD, or other suitable techniques. In some embodiments, the capping layer 105c is an optional layer that can be removed from the tri-layer discussed herein.

In some embodiments of the present disclosure, the metal layer 107 is formed to fill in a remainder of a gate trench in the metal gate stack (105, 107). The metal layer 107 includes any metal material suitable for forming a metal gate or portion thereof such as WN, TaN, or Ru. In some embodiments, the P-metal layer includes a multi-metal layer structure such as TiN/W, WN, and WCN.

In some embodiments, in addition to the work function adjusting layer 105 and the high-k dielectric layer 103, the metal gate stack (105, 107) further includes liner layers, interfacial layer, seed layers, adhesion layers, barrier layers or their equivalents.

In some embodiments, the ILD 109 includes a dielectric material. In some embodiments, the dielectric material includes silicon oxide, silicon nitride, silicon oxynitride, spin-on glass (SOG), fluorinated silica glass (FSG), carbon doped silicon oxide (e.g., SiCOH), BLACK DIAMOND® (Applied Materials of Santa Clara, Calif.), XEROGEL®, AEROGEL®, amorphous fluorinated carbon, Parylene, BCB (bis-benzocyclobutenes), FLARE®, SILK® (Dow Chemical, Midland, Mich.), polyimide, other proper porous polymeric materials, other suitable dielectric materials, and/or combinations thereof. In some embodiments, the ILD 109 includes a high density plasma (HDP) dielectric material (e.g., HDP oxide) and/or a high aspect ratio process (HARP) dielectric material (e.g., HARP oxide). It is understood that the ILD 109 may include one or more dielectric materials and/or one or more dielectric layers. The ILD 109 is planarized by a chemical-mechanical-polishing (CMP) process until a top portion of the metal gate stack (103, 105) is exposed as illustrated in FIG. 1. The CMP process includes a high selectivity to provide a substantially planar surface for the metal gate stack (103, 105), spacers 110, and ILD 109. In some embodiments, the CMP process has low dishing and/or metal erosion effect.

Figure 2:
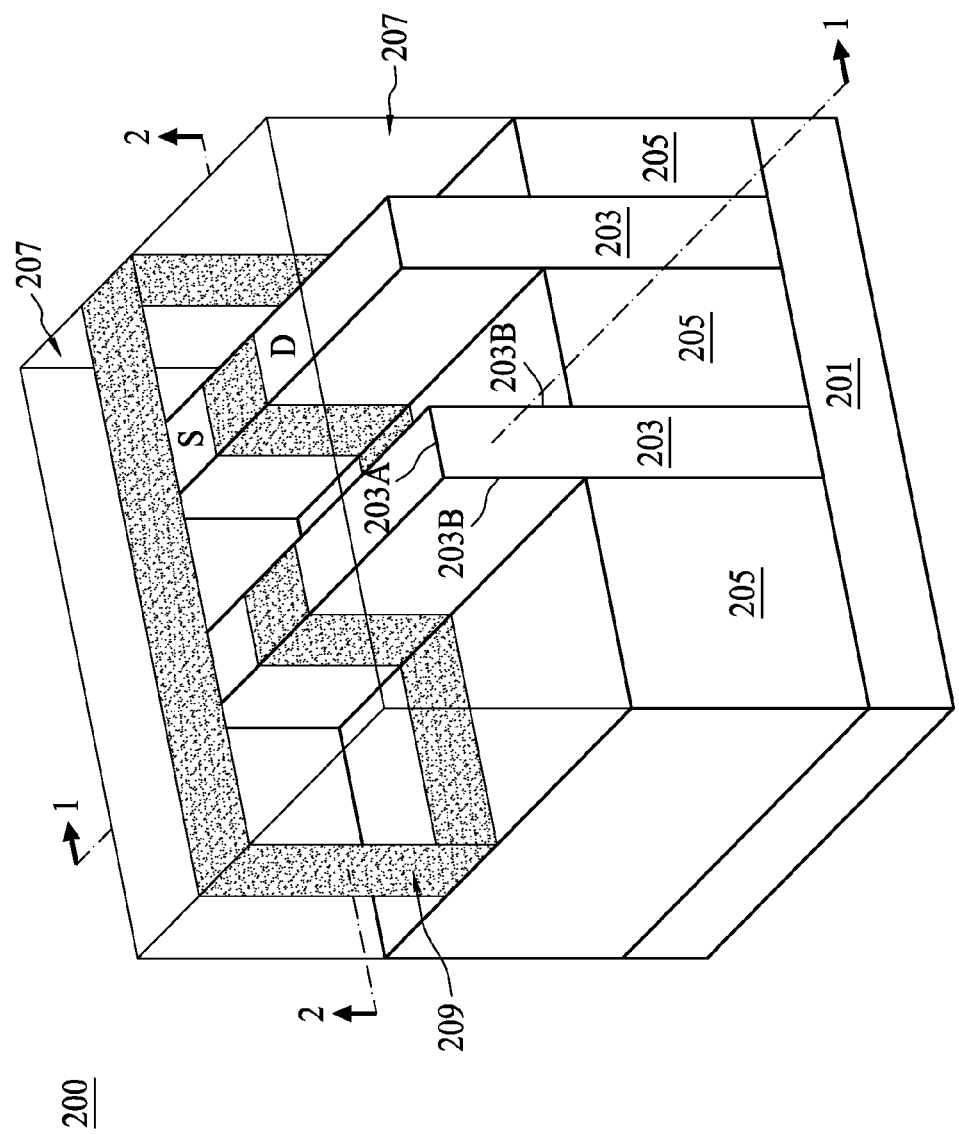
FIG. 2 is a perspective view of a Fin Field Effect Transistor (FinFET) with a metal gate structure in accordance with some embodiments of the present disclosure.

Referring to FIG. 2, a perspective view of a metal gate FinFET structure 200 is shown. Two semiconductor fins 203 are positioned on a substrate 201 and are separated by shallow trench isolation 205. Semiconductor fin 203 may be formed of silicon, silicon-germanium, germanium, or other suitable semiconductor materials. A metal gate 209 is over a top surface 203A and a sidewall 203B of the semiconductor fins 203. A channel of a transistor (not shown) is defined along the top surface 203A and the sidewall 203B of the semiconductor fin and extended between a source (S) and a drain (D) in the semiconductor fin 203. As shown in FIG. 2, ILD 207 are positioned over the top surface 203A and the sidewall 203B at the source (S) and the drain (D) portion of the semiconductor fins 203.

Figure 3A:
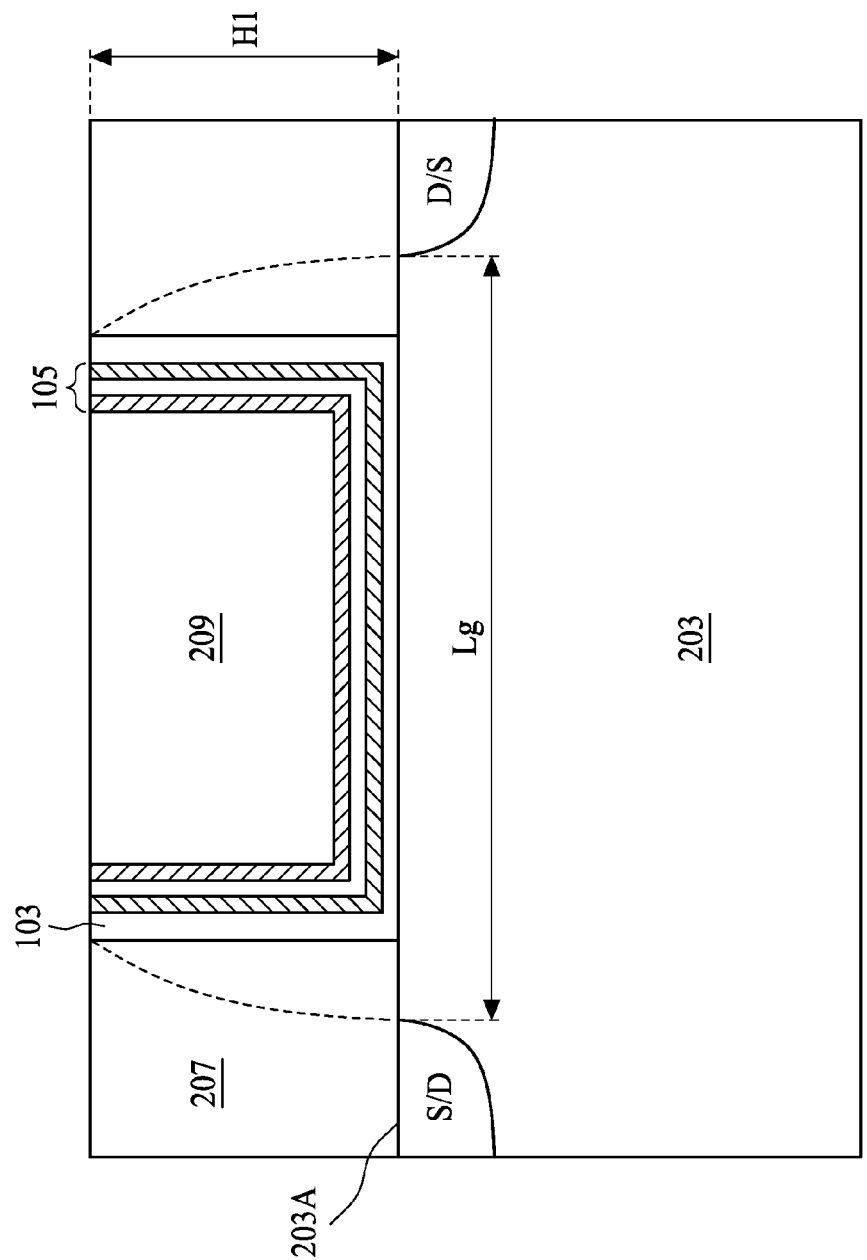
FIG. 3A is a cross sectional view of a metal gate of the FinFET structure shown in FIG. 2 in accordance with some embodiments of the present disclosure.
Figure 3B:
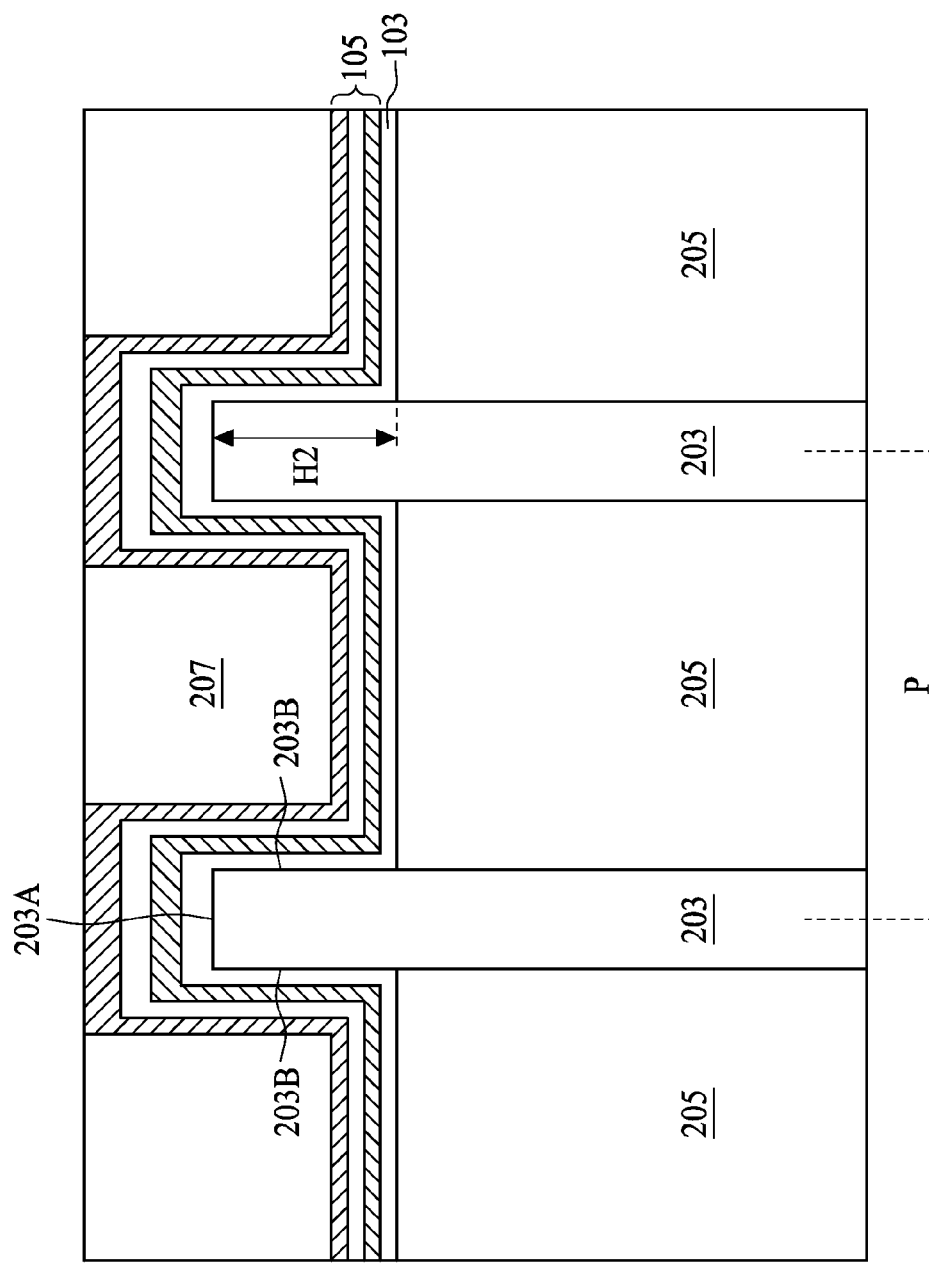
FIG. 3B is a cross sectional view of a metal gate of the FinFET structure shown in FIG. 2 in accordance with some embodiments of the present disclosure.

Referring to FIG. 3A and FIG. 3B, two cross sectional views of a MG FinFET structure are shown. The cross section shown in FIG. 3A is cutting from a first direction shown in FIG. 2. The first direction is parallel to a longitudinal axis of the semiconductor fin 203 and is denoted as "1". Elements with the same numeral labels in FIG. 3A and those in FIGS. 1 and 2 are directed to the same structure of materials, and are not repeated here for simplicity. In FIG. 3A, the metal gate stack (105, 107) are positioned on the semiconductor fin 203. A channel length $L_g$ is defined along the top surface 203A of the semiconductor fin 203 and extended between a source (S) and a drain (D) in the semiconductor fin 203. In some embodiments, the channel length $L_g$ in the MG FinFET structure is about 16 nm or below 16 nm. A height H1 of the metal gate stack (105, 107) is defined as a length measured from the leveled top surface of the metal gate to the top surface 203A of the semiconductor fin 203. In some embodiments, the height H1 of the metal gate stack (105, 107) is from about 20 nm to about 110 nm. In some embodiments, an aspect ratio of the metal gate stack (105, 107) is in a range of from about to about 1 to about 10. The aspect ratio of the metal gate stack (105, 107) refers to a ratio of the height of the metal gate stack (105, 107) and the channel length $L_g$ defined by the metal gate stack (105, 107). The greater the aspect ratio is, the greater the deposition control shall be imposed on the growth of the metal gate stack (105, 107).

The cross section shown in FIG. 3B is cutting from a second direction shown in FIG. 2. The second direction is perpendicular to a longitudinal axis of the semiconductor fin 203 and is denoted as "2". Elements with the same numeral labels in FIG. 3A and those in FIGS. 1 and 2 are directed to the same structure of materials, and are not repeated here for simplicity. In FIG. 3B, the work function adjusting layer 105 and the high-k dielectric layer 103 are conformally deposited on the top surface 203A and the sidewall 203B of the semiconductor fins 203. In the lower portion of FIG. 3B, the semiconductor fins 203 are separated by STI 205, whereas in the upper portion FIG. 3B, the semiconductor fins 203 are separated by ILD 207. The channel length of the FinFET structure cannot be seen from a cross section cutting along the second direction as shown in FIG. 3B. A fin height H2 is defined as a length measured from the top surface 203A of the semiconductor fin 203 to a top surface of the STI 205. In some embodiments, the fin height H2 is in a range of from about 5 nm to about 50 nm. A pitch P of a FinFET structure refers to a distance between two adjacent semiconductor fin 203 looking from a cross section shown as in FIG. 3B. In some embodiments, the pitch P between two adjacent metal gate FinFET structures is from about 5 nm to about 20 nm. In some embodiments, a ratio of the fin height H2 and the pitch P of a FinFET structure is in a range of from about to about 0.2 to about 10. A greater H2 to P ratio is, the greater the deposition control shall be imposed on the growth of the metal gate on a FinFET structure.

Figure 4B:
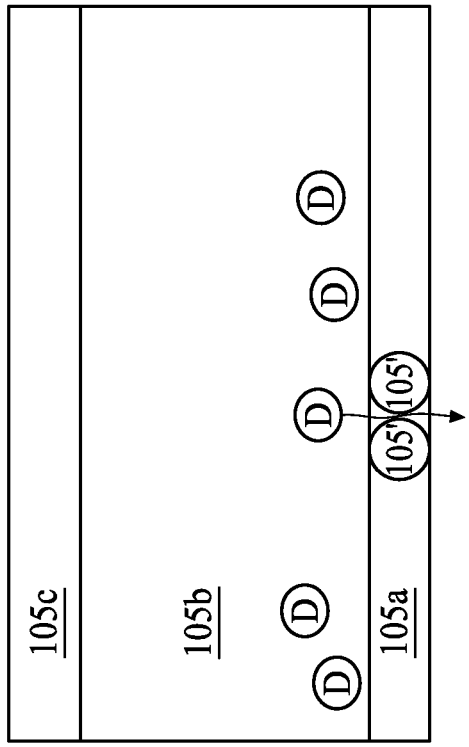
FIG. 4B is a schematic diagram showing a property of a grain boundary engineering layer in accordance with some embodiments of the present disclosure.
Figure 4A:
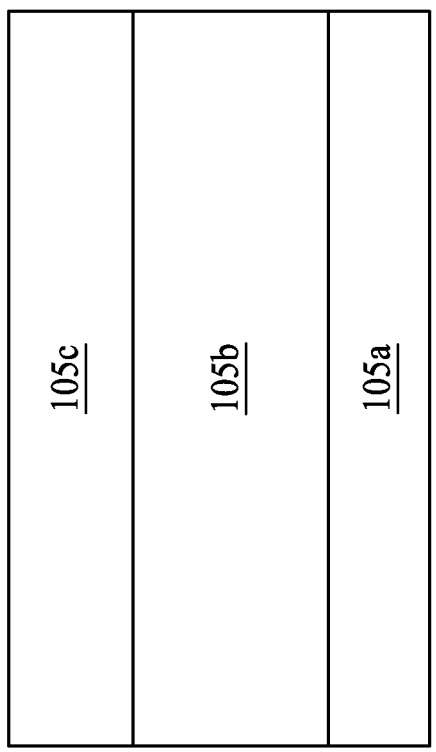
FIG. 4A is an enlarged cross sectional view of a tri-layer in a work function adjusting layer in accordance with some embodiments of the present disclosure.

Referring to FIG. 4A, an enlarged view of the work function adjusting layer 105 discussed herein are shown. In some embodiments, the work function adjusting layer is a tri-layer structure including an amorphous or a low crystalline GBEL 105a, a doping layer 105b, and an optional capping layer 105c. The function and the materials used for the above-mentioned tri-layer structure are recorded in the description referring to FIG. 1 of the present disclosure and are not repeated here for simplicity. FIG. 4B is a schematic diagram illustrating the dopants D penetrating from the doping layer 105b to the amorphous or a low crystallinity GBEL 105a. As shown in FIG. 4B, grain boundaries dividing two adjacent crystal grains 105' are the major diffusion channel for the dopants D.

Figure 5B:
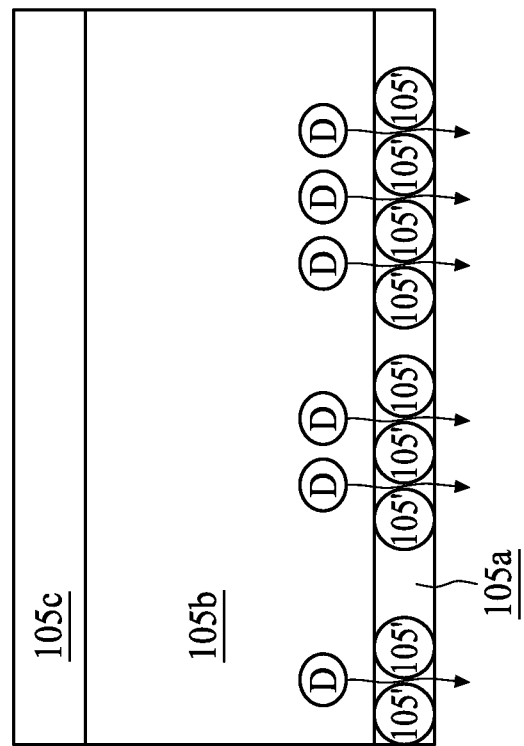
FIG. 5B is a schematic diagram showing a property of a grain boundary engineering layer in accordance with some embodiments of the present disclosure.
Figure 5A:
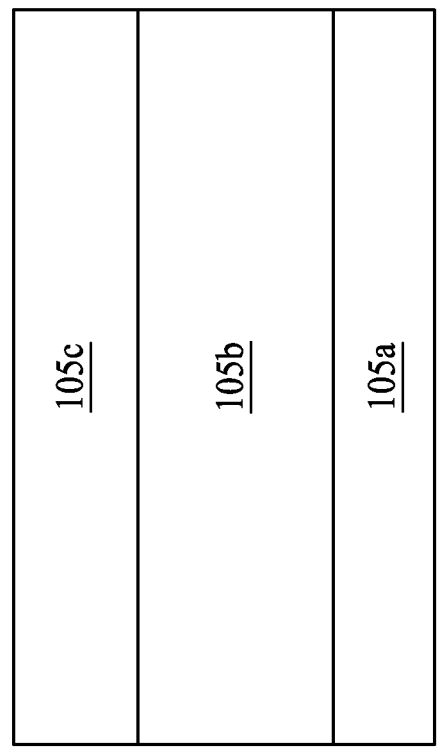
FIG. 5A is an enlarged cross sectional view of a tri-layer in a work function adjusting layer in accordance with some embodiments of the present disclosure.

Referring to FIG. 5A, an enlarged view of the work function adjusting layer 105 discussed herein are shown. In some embodiments, the work function adjusting layer 105 is a tri-layer structure including a high crystalline GBEL 105a, a doping layer 105b, and an optional capping layer 105c. The function and the materials used for the above-mentioned tri-layer structure are recorded in the description referring to FIG. 1 of the present disclosure and are not repeated here for simplicity. FIG. 5B is a schematic diagram illustrating the dopants D penetrating from the doping layer 105b to the high crystalline GBEL 105a. As shown in FIG. 5B, grain boundaries dividing two adjacent crystal grains 105' are the major diffusion channel for the dopants D.

As can be seen from FIG. 4A to FIG. 5B, the higher the crystallinity of the GBEL 105a, the greater the grain boundary density, and thus dopants from an overlaid layer are allowed to penetrate through the GBEL 105a and be positioned close to a channel region of a transistor.

Figure 6A:
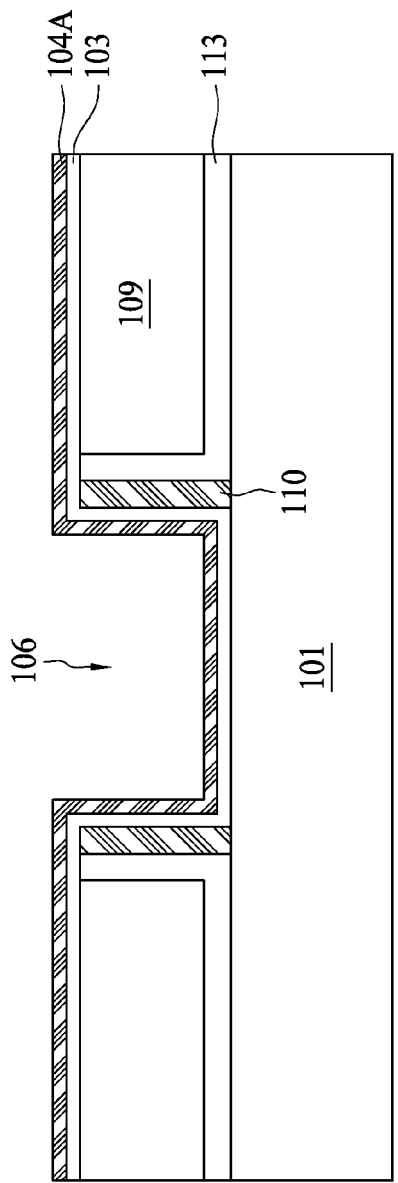
Figure 6B:
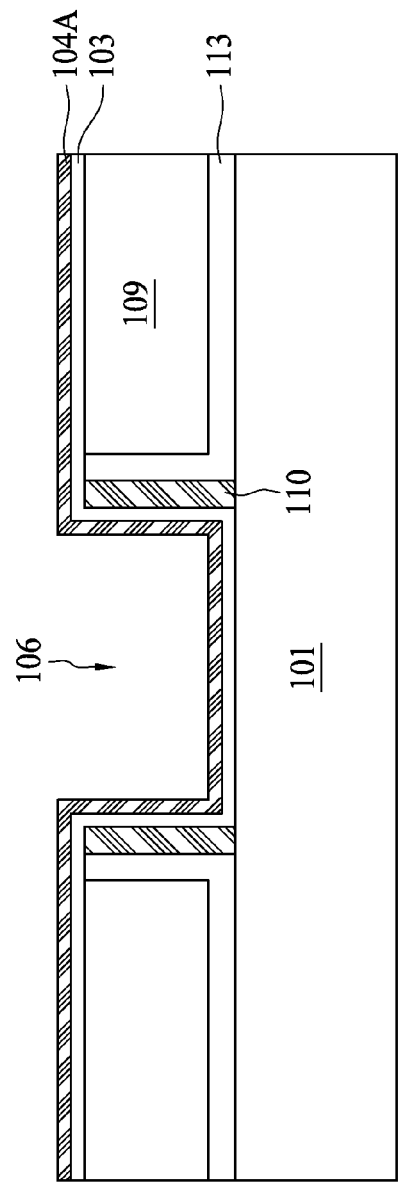

In some embodiments, FIG. 6A to FIG. 10B are operations showing a manufacturing method for a metal gate MOSFET structure. The operations shown in FIG. 6A to FIG. 10B provide a method of controlling a threshold voltage of a metal gate transistor structure by adjusting a degree of penetration in a GBEL 105a with respect to doping atoms in a doping layer 105b above the GBEL 105a by forming the GBEL105a at different temperatures. FIGS. 6A, 7A, 8A, 9A, 10A are operations of a manufacturing method for a metal gate in an NMOS structure, and FIGS. 6B, 7B, 8B, 9B, 10B are operations of a manufacturing method for a metal gate in a PMOS structure. Elements with the same numeral labels in FIG. 3A and those in FIGS. 6A, 7A, 8A, 9A, 10A are directed to the same structure of materials, and are not repeated here for simplicity. In FIG. 6A, an ILD 109, a nitride layer 113, a spacer 110, a high-k dielectric layer 103, an etch stop/barrier layer 104A, and a gate trench 106 is formed on a semiconductor substrate 101 according to the current art. A chemical mechanical polishing (CMP) operation is performed after the formation of the spacer 110, the nitride layer 113, and the ILD 109. The gate trench 106 is formed by removing dummy gate materials (not shown). The operation referring to the removal of the dummy gate materials are discussed in FIG. 12 to FIG. 17 of the present disclosure. In some embodiments, the high-k dielectric layer 103 and the etch stop/barrier 104A are formed after the removal of the dummy gate materials. In FIG. 6B, same operations are being carried out on a PMOS structure as those in FIG. 6A.

In some embodiments, the etch stop/barrier layer 104A is formed over the high-k dielectric layer 103. In some embodiments, the etch stop/barrier layer 104A includes TiN or TaN having a thickness ranging from about 5 to about 30 Å. The etch stop/barrier layer 104A functions as a barrier to protect the high-k dielectric layer 103. The etch stop/barrier layer 104A is formed by various deposition techniques such as ALD, PVD, CVD, PECVD, or other suitable technique.

Referring to FIG. 7A and FIG. 7B, a P work function layer 104B is formed over the etch stop/barrier layer 104A both in the NMOS (FIG. 7A) and in the PMOS (FIG. 7B) structure. In some embodiments, P work function layer 104B may be formed by ALD, PVD, CVD, or other suitable process. Alternatively, the P work function layer 104B includes other suitable metals, such as TiN, TaN, or Ru, that properly perform in a PMOS device. In some embodiments, the P work function layer 104B includes a multi-metal layer structure such as TiN/WN.

Figure 8A:
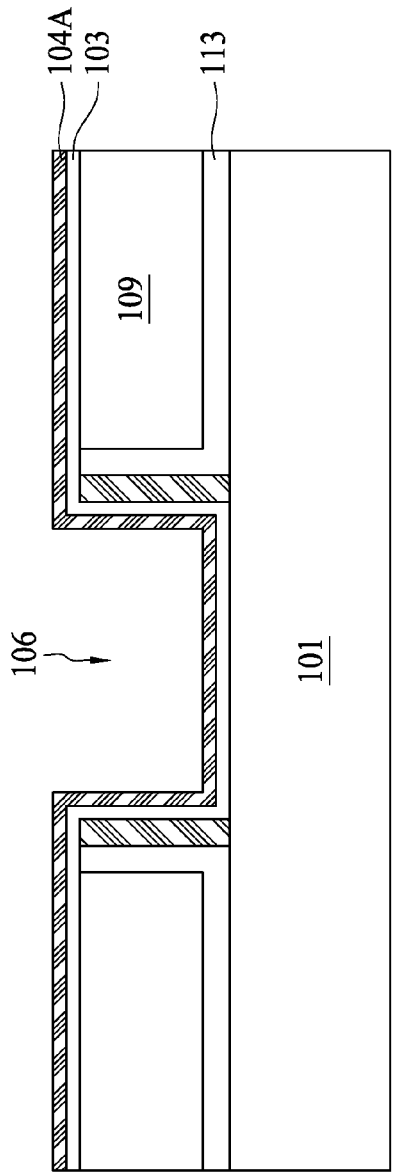
Figure 8B:
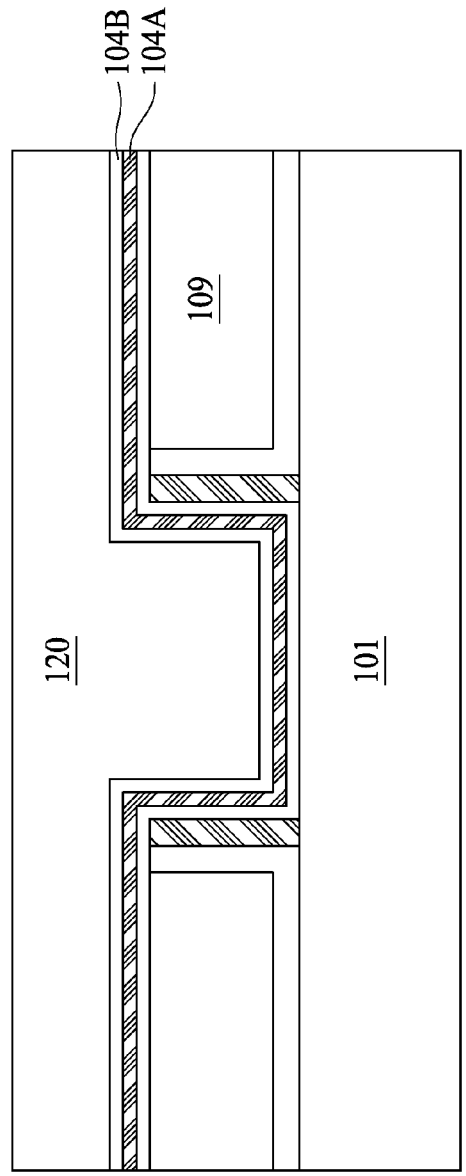

Referring to FIG. 8A and FIG. 8B, an etching operation is carried out to remove the P work function layer 104B at the NMOS structure formed in FIG. 7A. A spin-on-glass (SOG) 120 is formed over the gate trench 106 of the PMOS structure (FIG. 8B), functioning as an etch mask to prevent the P work function layer 104B from being removed over the PMOS structure. In some embodiments, an SOG 120 is spun on both the NMOS and the PMOS structure, a photoresist layer is further patterned over the blanket SOG 120, exposing a region over the NMOS structure. A dry etch operation is carried out to remove the portion of the SOG 120 not covered by the photoresist layer. Subsequently, the exposed P work function layer 104B is removed by a dry etch, wet etch, combination dry and wet etch, or other suitable process. The photoresist and the SOG 120 is then stripped after the removal of the P work function layer 104B.

Figure 9A:
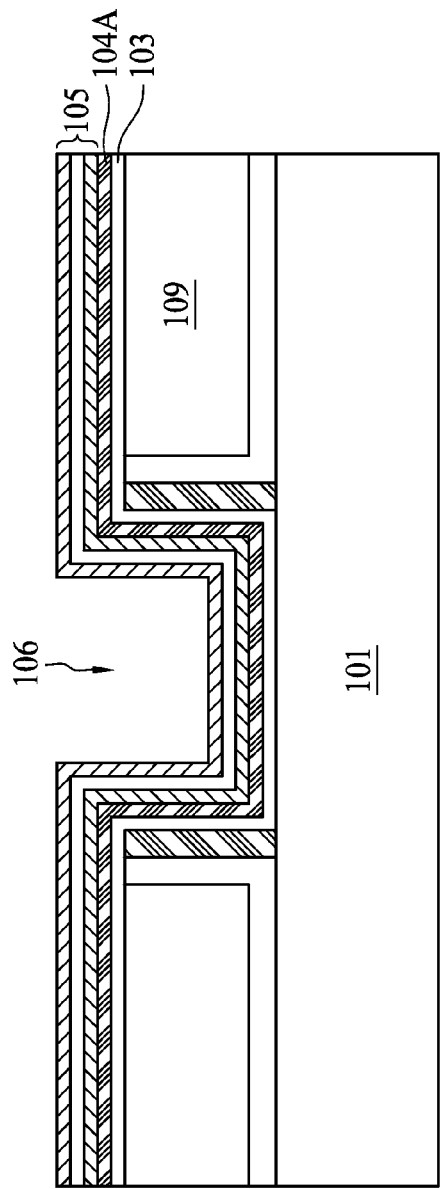
Figure 9B:
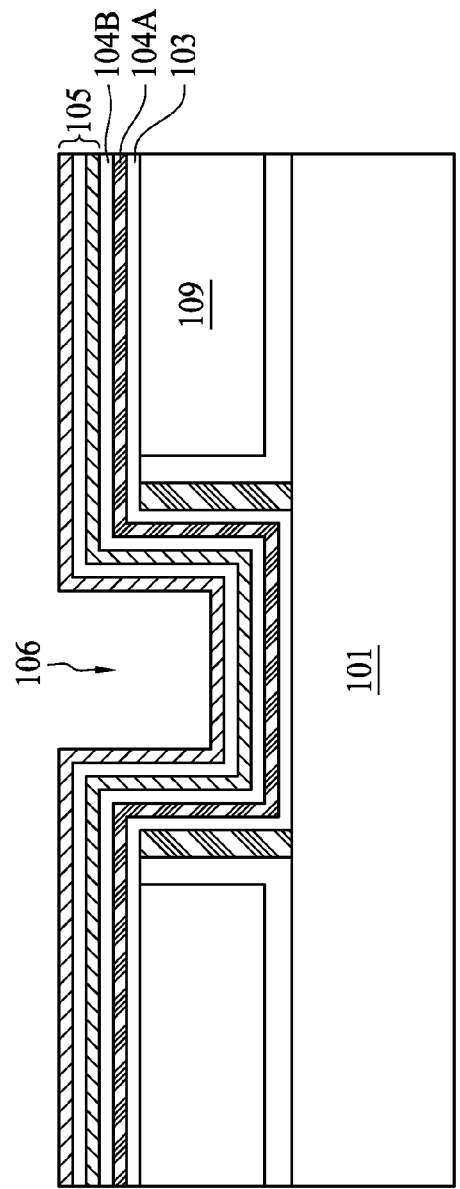

Referring to FIG. 9A and FIG. 9B, the work function adjusting layer 105 is formed over the etch stop/barrier layer 104A on the NMOS structure (FIG. 9A) and over the P work function layer 104B on a PMOS structure (FIG. 9B). In some embodiments, the work function adjusting layer 105 includes a tri-layer structure which is deposited by several ALD operations. In some embodiments, the GBEL 105a of the tri-layer structure 105 is a TaN film formed by an ALD operation at a substrate temperature of about 225 degrees Celsius. In other embodiments, the GBEL 105a of the tri-layer structure 105 is a TaN film formed by an ALD operation at a substrate temperature of about 275 degrees Celsius. In other embodiments, the GBEL 105a of the tri-layer structure 105 is a TaN film formed by an ALD operation at a substrate temperature of about 325 degrees Celsius. As discussed previously in FIG. 4A to FIG. 5B, the selection of the growth temperature in the ALD operation for GBEL 105a growth depends on the degree of dopant penetration desired. In some embodiments, the thickness of the GBEL 105a is related to the "closure" status of the GBEL 105a. For example, in some embodiments, 30 ALD cycles are performed under a substrate temperature of about 325 degrees Celsius to obtain a closure film. In some embodiments, the GBEL 105a fulfilling a "closure" status is from about 10 Å to about 25 Å.

Figure 11:
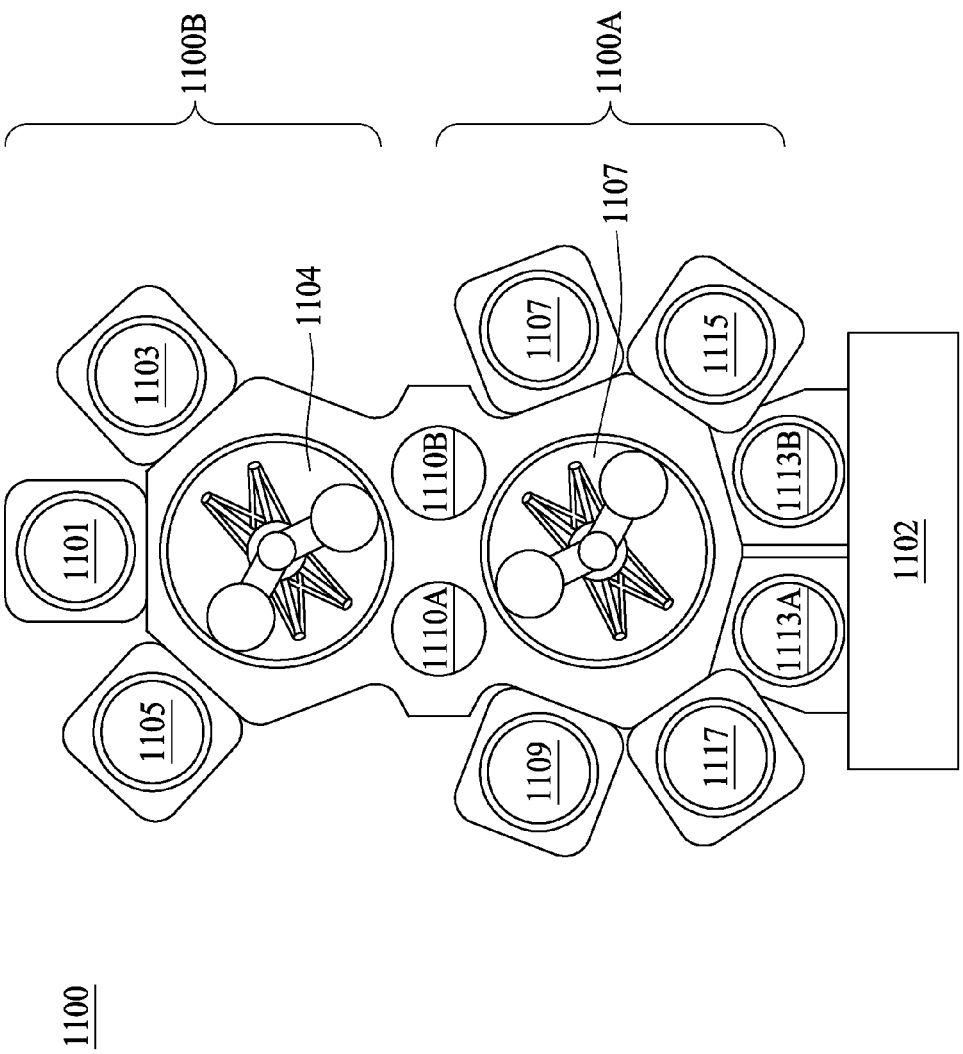
FIG. 11 is a semiconductor wafer manufacturing tool with multiple growth chambers in accordance with some embodiments of the present disclosure.

After the formation of the GBEL 105a, the metal gate MOSFET structure is then transfer to another growth chamber within a same system without vacuum break. Because no surface oxidation occurs during the wafer transfer from one growth chamber to another, no oxide layer is identified over the GBEL 105a. In other words, no oxide layer is formed between the doping layer 105b and the GBEL 105a. In some embodiments, the system used to from the tri-layer structure is Applied Material Endura® cluster as illustrated in FIG. 11. In some embodiments, the Applied Material Endura® cluster is equipped with chlorine comparable main frame to prevent chamber corrosion due to chlorine generation in the course of an ALD growth. The transfer mechanism for the tri-layer structure growth is discussed in detail in FIG. 11.

The doping layer 105b is formed in the same system that grows the GBEL 105a but in a different chamber. In some embodiments, an ALD operation is used to grow the doping layer 105b containing aluminum with a selection of precursor dimethylaluminumhydride (DMAH), dimethylethylaminealane (DMEAA), or both. For example, the deposition temperature for the doping layer 105b is from about 100 to about 200 degrees Celsius.

After the formation of the doping layer 105b, the metal gate MOSFET structure is then transfer to another growth chamber within a same system without vacuum break. The capping layer 105c is an optional layer in the tri-layer structure. In some embodiments, the capping layer 105c includes suitable metal such as TiN or TaN. The capping layer 105c is formed by an ALD operation in situ in the same system to prevent surface oxidation of the aluminum-containing doping layer 105b. In some embodiments, the thickness of the capping layer 105c depends on the "closure" status of the film. For example, 25 to 45 ALD cycles is sufficient to obtain a capping layer 105c with a thickness of from about 5 Å to about 20 Å.

Referring to FIG. 10A and FIG. 10B, a metal layer 107 is overfilled into the gate trench 106. In some embodiments, a single metal including W, WN, TaN, or Ru is sputtered into the gate trench 106, and followed by a CMP operation to expose the capping layer 105c of the tri-layer structure. In some embodiments, the metal layer 107 includes a multi-metal layer structure such as TaN, TiN, W, WN, and WCN, or any combination thereof.

In other embodiments, FIG. 6A to FIG. 10B are operations showing a manufacturing method for a metal gate FinFET structure looking at the first direction defined in FIG. 2. The manufacturing operations for the metal gate FinFET structure is similar to that for the metal gate MOSFET structure and are not repeated here for simplicity. In performing the metal gate FinFET growth, the semiconductor substrate 101 shown in FIG. 6A to FIG. 10B is replaced with the semiconductor fin 203 as shown in FIG. 3A.

Referring to FIG. 11, the configuration of a semiconductor wafer manufacturing system 1100 used to form the work function adjusting layer (i.e. the tri-layer structure) in some embodiments of the present disclosure is shown. The semiconductor wafer manufacturing system 1100 has several growth chambers arranged in each of the two clusters 1100A and 1100B. Each layer in the tri-layer structure discussed herein can be formed inside the semiconductor wafer manufacturing system 1100 without ambient contact.

Two load lock chambers 1113A and 1113B are configured to receive a wafer transferred from a load port 1102. The load lock chambers 1113A and 1113B are vented to a pressure equivalent to the load port 1102 while a wafer is transferring between the load port 1102 and the load lock chambers 1113A and 1113B. When moving the wafer from the load lock chamber 1113A and 1113B into one of the chambers in the system 1100, the load lock chambers 1113A and 1113B are pumped down to a certain degree of vacuum that is closer to the vacuum level inside the clusters 1100A and 1100B.

Clusters 1100A and 1100B each has at least one mechanical means such as a robot arm 1104 or 1107 which transfers the wafer parked in the pumped-down load lock chamber 1113A and 1113B to one of the growth chambers. In some embodiments, one chamber 1101 is attached to cluster 1100B and is loaded with precursors for TaN film ALD growth. For example, the precursor includes Pentakis-dimethylamino Tantalum (PDMAT) and $NH_3$ gas. In some embodiments, the growth temperature in chamber 1101 is maintained in a range of from about 200 to about 350 degrees Celsius.

In some embodiments, two chambers 1103 and 1105 are symmetrically attached to cluster 1100B, and are loaded with precursors for $TiAl_x$ film ALD growth. For example, the precursor includes dimethylaluminumhydride (DMAH) or dimethylethylaminealane (DMEAA). In some embodiments, the growth temperature in chambers 1103 and 1105 are maintained in a range of from about 90 to about 250 degrees Celsius.

In some embodiments, two chambers 1107 and 1109 are symmetrically attached to cluster 1100A, and are loaded with precursors for TiN film ALD growth. For example, the precursor includes titanium tetrachloride ($TiCl_4$) and $NH_3$ gas. In some embodiments, the growth temperature in chambers 1103 and 1105 are maintained in a range of from about 100 to about 500 degrees Celsius.

In some embodiments, two chambers 1115 and 1117 are symmetrically attached to cluster 1100A, and are loaded with metal target or precursors for the growth of other suitable film. In some embodiments, chambers 1115 and 1117 are loaded with tungsten (W) or cobalt (Co) target and are introduced with argon gas in order to grow the metal layer 107 that fills up the gate trench 106 referred herein. Cooling chambers 1110A and 1110B allow a wafer to cool down to a desired temperature at an appropriate cooling rate in between the thin film growth without ambient contact.

Each wafer is assigned with a sequence of operations according to a recipe. In some embodiments, the tri-layer structure discussed herein is first transferred from the load lock chamber 1113A and/or 1113B to the cluster 1100B through robot arms 1107 and 1104. The wafer is sent into chamber 1101 for the GBEL 105a growth. As previously discussed in the present disclosure, an ALD growth temperature of a TaN GBEL 105a can be adjusted from about 200 to about 350 degrees Celsius. In some embodiments, after a closure GBEL 105a is obtained, the wafer is then transferred from chamber 1101 to chamber 1103 or chamber 1105 for the growth of the doping layer 105b. Because the transfer operation between the growth of the GBEL 105a and that of the doping layer 105b is conducted inside the cluster 1100B, no ambient contact or oxygen contamination is formed on the GBEL 105a. A fresh GBEL 105a provides abundant free electrons for the precursors DMAH or DMEAA to be absorbed on the surface thereof, facilitating the ALD growth reaction of the aluminum-containing doing layer 105b. In addition, the absence of the oxide layer over the GBEL 105a provides a more open channel for the aluminum to diffuse from the doping layer 105b to the GBEL 105a.

After the formation of the doping layer 105b, the wafer is transferred from chamber 1103 or 1105 to chamber 1107 or 1109 in cluster 1100A. In some embodiments, a capping layer 105c, for example, a TiN layer, is formed inside chamber 1107 or 1109 by an ALD operation. In addition, the wafer can be transferred from chamber 1107 or 1109 to chamber 1115 or 1117 to fill the metal layer 107 inside the gate trench 106. After the metal layer 107 is filmed, the wafer can then be parked to the load lock chambers 1113A and 1113B. The vacuum level inside the load lock chambers chamber 1113A and 1113B are raised to a level comparable to the load port 1102, and the wafer is then transferred to the load port 1102 and taken out for subsequent operations.

After the formation of the gate structure (e.g., gate etching or patterning), the wafer containing MOSFET or FinFET structure undergoes additional CMOS processing to form various device features as known in the art. In some embodiments, the various features include, but not limited to, lightly doped source/drain regions (n-type and p-type LDD), source/drain (S/D) regions, silicide features, contact etch stop layer (CESL). It should be noted that strained structures such as silicon germanium (SiGe) and silicon carbide (SiC) features may be formed in the P-type and/or N-type devices, respectively.

Figure 12:
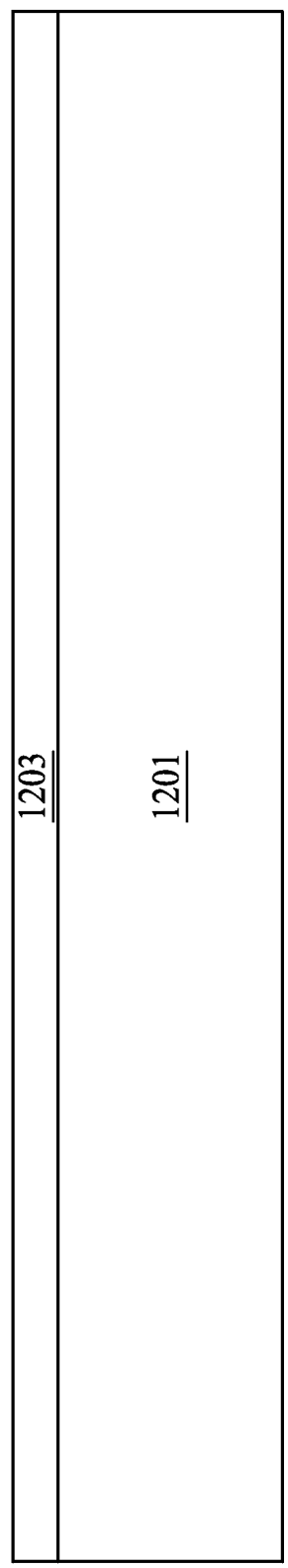
FIG. 12 to FIG. 17 are operations of a gate last manufacturing method for a metal gate in accordance with some embodiments of the present disclosure.

FIG. 12 to FIG. 17 show operations of a "gate last" manufacturing method for a metal gate structure described herein. The cross sectional view shown in FIG. 12 to FIG. 17 is a dissection along direction 1 shown in FIG. 2. In FIG. 12, according to some embodiments of present disclosure, semiconductor fin 1201 is formed over a semiconductor substrate (not shown). A sacrificial dielectric layer 1203 is formed on the semiconductor fin 1201. In some embodiments, the sacrificial dielectric layer 1203 is optional. In some embodiments, the sacrificial dielectric layer 1203 includes an oxide formed either by thermal or chemical vapor deposition. In some embodiments, the sacrificial dielectric layer 1203 is formed in a single wafer chamber equipment. In some embodiments, the sacrificial dielectric layer 1203 is formed in a furnace using a batch mode.

Figure 13:
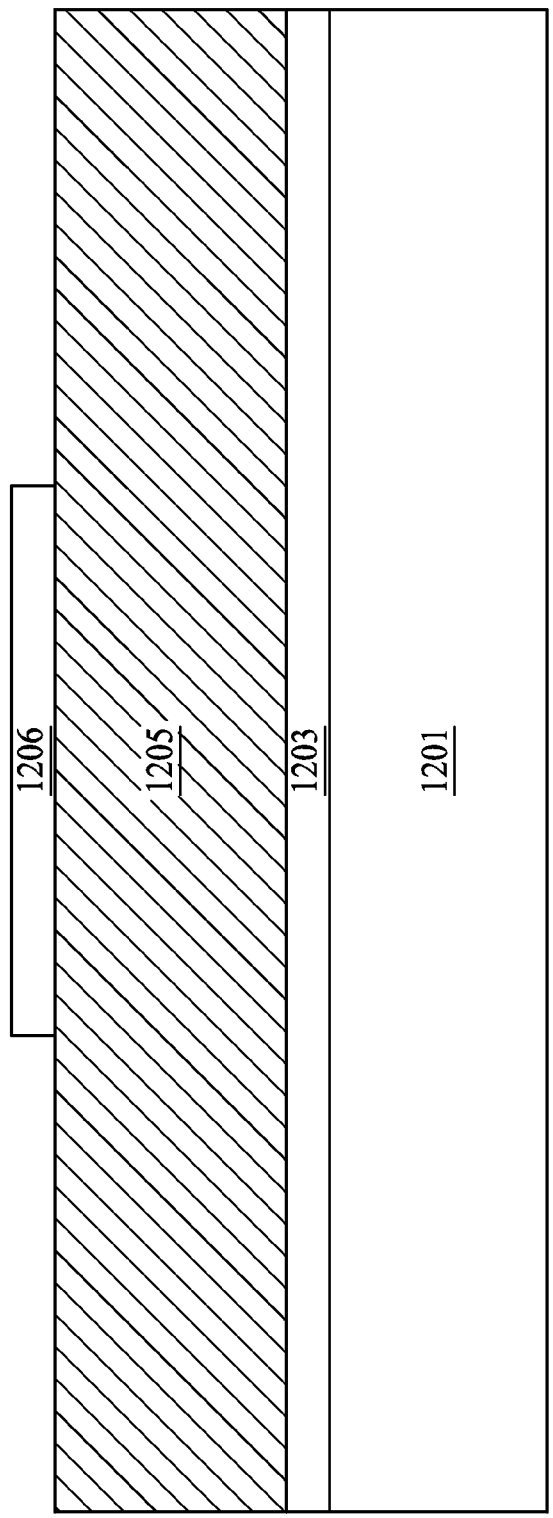

In FIG. 13, a dummy gate 1205 is formed over the sacrificial dielectric layer 1203. In some embodiments, the dummy gate 1205 is formed by physical vapor deposition, chemical vapor deposition (CVD), or other suitable deposition operation. In some embodiments, silane ($SiH_4$), di-silane ($Si_2H_6$), or di-chlorsilane ($SiCl_2H_4$) may be used in a CVD operation to form the dummy gate 1205. The dummy gate 1205 may include a thickness ranging from about 150 Å to about 2500 Å.

Figure 14:
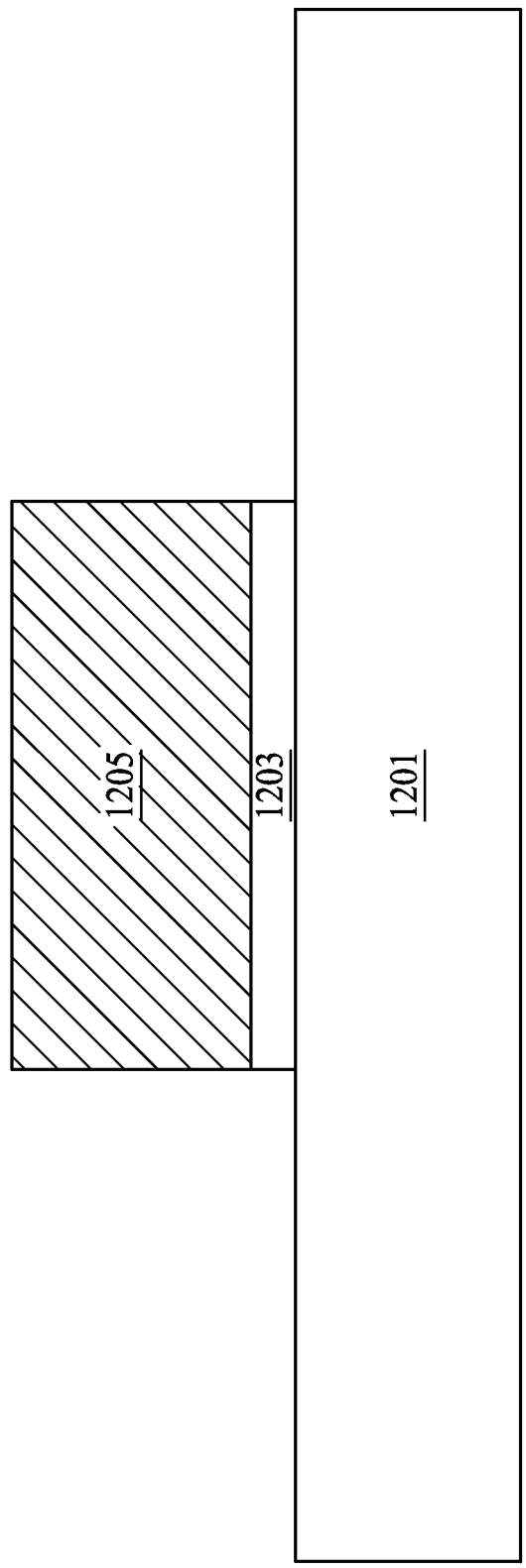

Referring to FIG. 13 and FIG. 14, a hard mask layer 1206 is patterned over the dummy gate 1205 and the pattern is transferred to the underlying dummy gate 1205 and the optional sacrificial dielectric layer 1203. In some embodiments, the hard mask layer 1206 includes silicon nitride, silicon oxynitride, silicon carbide, and/or other suitable dielectric materials, and may be formed using a method such as chemical vapor deposition (CVD) or physical vapor deposition (PVD or sputtering). The hard mask layer 1206 includes a thickness between about 100 and about 400 Å. In some embodiments, an antireflective coating layer (ARC) is formed on the hard mask layer to enhance a photolithography process for patterning a photoresist layer. For example, a patterned photoresist layer (not shown) may be formed on the hard mask layer 1206. The pattern of the hard mask layer 1206 is then transferred to the dummy gate 1201 by a dry etch, a wet etch, or the combinations thereof.

Figure 15:
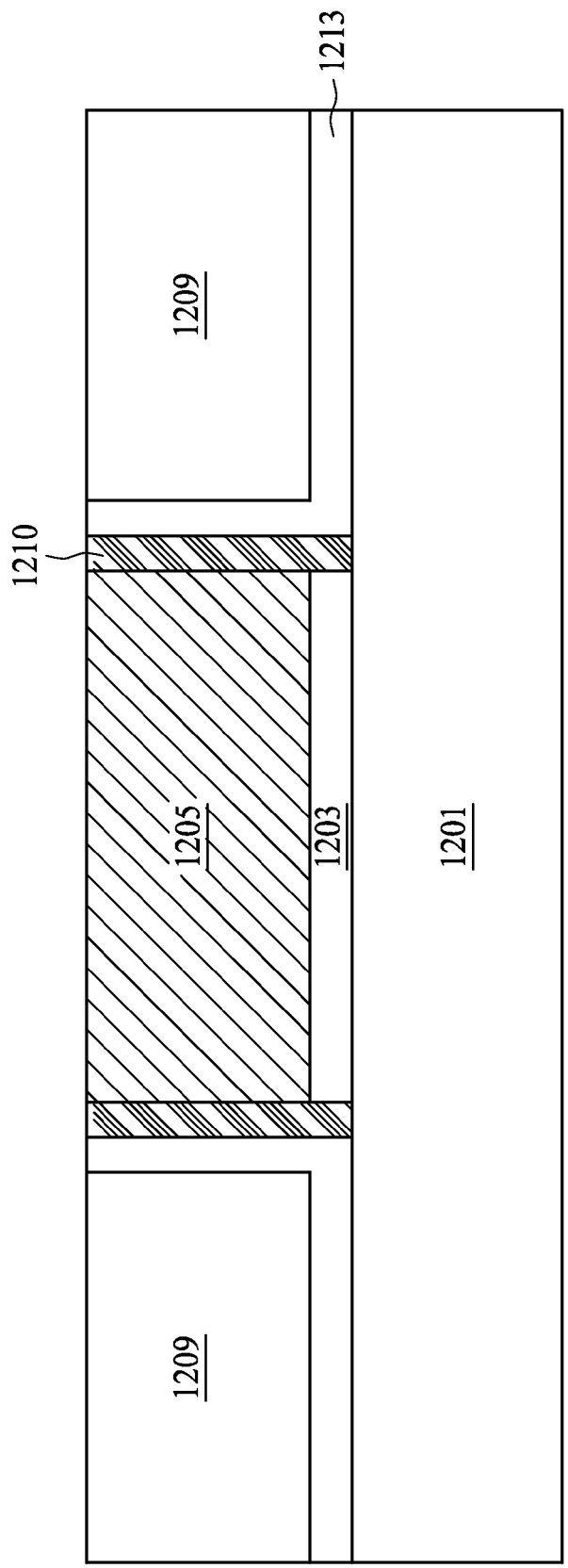

In FIG. 15, sidewall spacers 1210, nitride layers 1213, and an interlayer dielectric (ILD) 1209 are formed. It is understood that the ILD 1209 may include one or more dielectric materials and/or one or more dielectric layers. The materials used for ILD 1209 is discussed previously referring to FIG. 6A and is not repeated here for simplicity. In some embodiments, the ILD 1209 is planarized by a chemical-mechanical-polishing (CMP) process until a top portion of the dummy gate 1205 is exposed as illustrated in FIG. 15.

Figure 16:
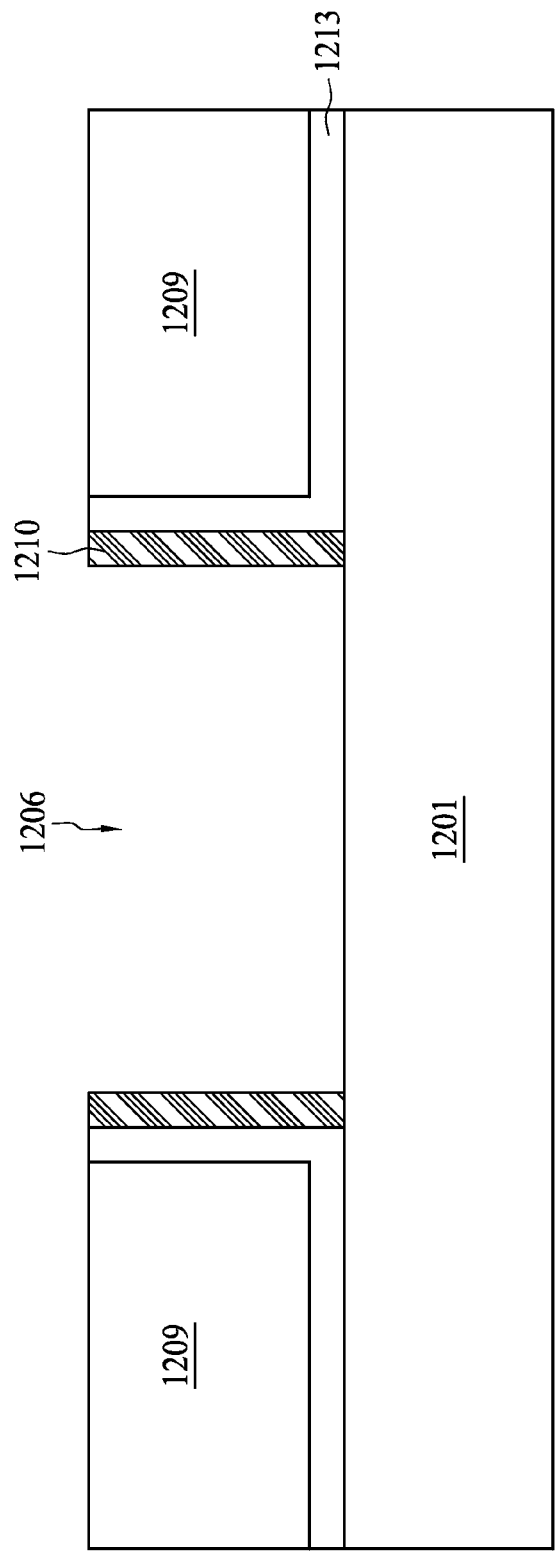

In FIG. 16, a gate replacement process is performed. The dummy gate 1205 and the sacrificial dielectric layer 1203 are removed by a dry etch, wet etch, combination dry and wet etch, or other suitable process. In some embodiments, the dummy gate 1205 and sacrificial dielectric layer 1203 are removed in a single-step etching process or multiple-step etching process. For example, a first wet etch process is used to remove the dummy gate 1205. The first wet etch process may include exposure to a hydroxide containing solution (e.g., ammonium hydroxide), de-ionized water, and/or other suitable etchant solutions. A second wet etch process is used to remove the sacrificial dielectric layer 1203. The second wet etch process includes exposure to a buffered HF solution or a buffered oxide etchant (BOE). The second wet etch process may selectively remove the sacrificial dielectric layer 1203 and stops at the semiconductor fin 1021, thereby forming a trench 1206 in the metal gate structure. It is understood that other etching chemicals may be used for selectively removing the sacrificial dielectric layer 1203 and dummy gate 1205.

Figure 17:
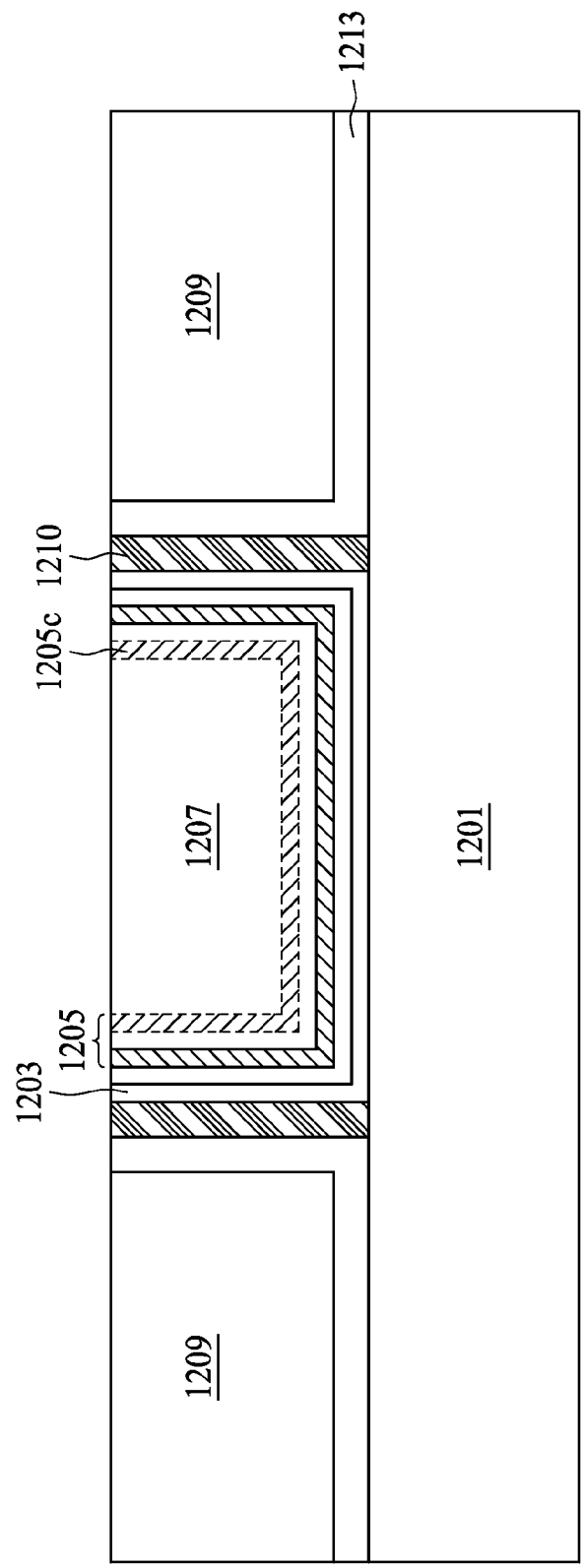

In FIG. 17, the high-k dielectric layer 1203 and the work function adjusting layer 1205 are formed inside the gate trench 1206 as previously discuss herein. The metal layer 1207 is filled into the remaining space in the gate trench 1206 and a CMP operation is carried out to level up a top surface of the metal gate structure until the metal layer 1207 is exposed. As shown in FIG. 17, a capping layer 1205c in the work function adjusting layer 1205 is optional.

In some embodiments, a metal gate structure is manufactured by the following operations: forming a high-k dielectric layer in a gate trench; forming an etch stop over the high-k dielectric layer; forming a work function adjusting layer over the etch stop by forming a tri-layer with a sequence of a grain boundary engineering layer configured to allow a dopant atom to penetrate there through, a doping layer configured to provide the dopant atom to the grain boundary engineering layer, and a capping layer configured to prevent the doping layer from oxidation; and filling a metal to level up the gate trench.

In some embodiments, the forming the tri-layer with the sequence of a grain boundary engineering layer, a doping layer, and a capping layer in a metal gate manufacturing operation comprises using an atomic layer deposition (ALD) operation.

In some embodiments, a dimethylaluminumhydride (DMAH) or a dimethylethylaminealane (DMEAA) is used as a precursor in forming the doping layer in the ALD operation used in a metal gate manufacturing operation.

In some embodiments, the formation of the grain boundary engineering layer comprises performing an ALD operation within a temperature range of from about 200 to about 350 degrees Celsius in a metal gate manufacturing operation.

In some embodiments, the formation of the grain boundary engineering layer comprises performing sufficient ALD cycle to form a closure film in a metal gate manufacturing operation.

In some embodiments, the metal gate structure is transferred from a chamber forming the grain boundary engineering layer to another chamber forming the doping layer under vacuum.

In some embodiments, the metal gate manufacturing operation further comprises forming a P-work function layer before the forming the work function adjusting layer; and removing the P-work function layer before the forming the work function adjusting layer.

In some embodiments, the metal gate manufacturing operation further comprises defining a dummy gate region; and removing a portion of the dummy gate region to expose the gate trench.

In some embodiments, a metal gate structure in a FinFET is manufactured by the following operations: forming a fin;

forming a dummy gate and an interlayer dielectric (ILD) over the fin; removing a portion of the dummy gate to expose a gate trench; and forming a work function adjusting layer in the gate trench by forming a grain boundary engineering layer and a doping layer over the grain boundary engineering layer.

In some embodiments, the formation of the grain boundary engineering layer comprises performing an ALD operation within a temperature range of from about 200 to about 350 degrees Celsius in a metal gate structure manufacturing operation in a FinFET.

In some embodiments, the formation the grain boundary engineering layer and the doping layer comprise preventing surface oxidation of the grain boundary engineering layer by transferring the metal gate structure in the FinFET from a chamber performing the formation of the grain boundary engineering layer to another chamber performing the formation of the doping layer under vacuum.

In some embodiments, a manufacturing operation of the metal gate structure in the FinFET further comprises forming a capping layer over the doping layer.

In some embodiments, a semiconductor structure with a metal gate comprises a high-k dielectric layer; a work function adjusting layer; and a metal layer. The work function adjusting layer comprises a grain boundary engineering layer, configured to allow a dopant atom to penetrate there through; a doping layer over the grain boundary engineering layer, configured to provide the dopant atom to the grain boundary engineering layer; and a capping layer over the doping layer, configured to prevent the doping layer from oxidation. The work function adjusting layer is sandwiched between the high-K dielectric layer and the metal layer.

In some embodiments, the semiconductor structure with a metal gate is a Fin Field Effect Transistor (FinFET).

In some embodiments, a gate length of the metal gate in the FinFET is below 16 nm.

In some embodiments, an aspect ratio of a height of the metal gate and a gate length of the FinFET is in a range of from about 1 to about 10.

In some embodiments, an aspect ratio of a fin height and a pitch between adjacent fins is in a range of from about 0.2 to about 10.

In some embodiments, the grain boundary engineering layer in a gate structure of the FinFET is an amorphous closure film.

In some embodiments, the grain boundary engineering layer in a gate structure of the FinFET is a crystalline closure film.

In some embodiments, a thickness of the grain boundary engineering layer in a gate structure of the FinFET is in a range of from about 10 Å to about 30 Å.

Moreover, the scope of the present application is not intended to be limited to the particular embodiments of the process, machine, manufacture, and composition of matter, means, methods and steps described in the specification. As those skilled in the art will readily appreciate form the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, and compositions of matter, means, methods or steps. In addition, each claim constitutes a separate embodiment, and the combination of various claims and embodiments are within the scope of the invention.

What is claimed is:

1. A method for tuning a threshold voltage of a semiconductor device with a metal gate structure, comprising:
    forming a high-k dielectric layer in a gate trench;
    forming an etch stop over the high-k dielectric layer;
    forming a work function adjusting layer over the etch stop by forming a tri-layer with a sequence of a grain boundary engineering layer configured to allow a dopant atom to penetrate there through, a doping layer configured to provide the dopant atom to the grain boundary engineering layer, and a capping layer configured to prevent the doping layer from oxidation; and
    filling a metal in the gate trench,
    wherein a degree of penetration of the dopant atom is controlled by adjusting a growth temperature within a range of from about 200 to about 350 degrees Celsius during forming the grain boundary engineering layer.

2. The method of claim 1, wherein the forming the tri-layer with the sequence of a grain boundary engineering layer, a doping layer, and a capping layer comprises using an atomic layer deposition (ALD) operation.

3. The method of claim 2, a dimethylaluminumhydride (DMAH) or a dimethylethylaminealane (DMEAA) is used as a precursor in forming the doping layer in the ALD operation.

4. The method of claim 1, wherein the metal gate structure is transferred from a chamber forming the grain boundary engineering layer to another chamber forming the doping layer under vacuum.

5. The method of claim 1, further comprising:
    forming a P work function layer before the forming the work function adjusting layer; and
    removing the P work function layer before the forming the work function adjusting layer.

6. The method of claim 1, further comprising:
    defining a dummy gate region; and
    removing a portion of the dummy gate region to expose the gate trench.

7. The method of claim 1, wherein forming the grain boundary engineering layer comprises forming a TiN layer with a thickness of from about 15 Å to about 20 Å.

8. The method of claim 1, wherein forming the doping layer comprises forming a $TiAl_x$ layer with a thickness of from about 20 Å to about 50 Å.

9. A method for tuning a threshold voltage of a FinFET, comprising:
    forming a fin;
    forming a dummy gate and an interlayer dielectric (ILD) over the fin;
    removing a portion of the dummy gate to expose a gate trench;
    forming a work function adjusting layer in the gate trench by forming a grain boundary engineering layer and a doping layer over the grain boundary engineering layer,
    wherein a degree of penetration of a dopant atom from the doping layer is controlled by adjusting a growth temperature within a range of from about 200 to about 350 degrees Celsius during forming the grain boundary engineering layer.

10. The method of claim 9, wherein the forming the grain boundary engineering layer and the doping layer comprises preventing surface oxidation of the grain boundary engineering layer by transferring the metal gate structure in the FinFET from a chamber performing the formation of the grain boundary engineering layer to another chamber performing the formation of the doping layer under vacuum.

11. The method of claim 9, further comprising forming a capping layer over the doping layer.

12. A method for tuning a threshold voltage of an n-type semiconductor device with a metal gate structure, comprising:
- forming a high-k dielectric layer in a gate trench;
- forming a work function adjusting layer over the high-k dielectric layer by forming a grain boundary engineering layer having a grain boundary density, configured to allow a dopant atom to penetrate there through,
- wherein a degree of penetration of the dopant atom is controlled by the grain boundary density through adjusting a growth temperature within a range of from about 200 to about 350 degrees Celsius during forming of the grain boundary engineering layer,
- wherein a lower threshold voltage of the n-type semiconductor device is obtained by performing a greater growth temperature within the range during the forming the grain boundary engineering layer.

13. The method of claim 12, wherein forming the work function adjusting layer further comprises:
- forming a doping layer over the grain boundary engineering layer, configured to provide the dopant atom to the grain boundary engineering layer; and
- forming a capping layer over the doping layer, configured to prevent the doping layer from oxidation.

14. The method of claim 12, wherein forming the grain boundary engineering layer comprises performing an atomic layer deposition (ALD) operation with at least 30 cycles under a temperature of about 325 degrees Celsius.

15. The method of claim 13, wherein the forming the doping layer over the grain boundary engineering layer comprises forming a $TiAl_x$ layer with a thickness of from about 20 Å to about 50 Å.

16. The method of claim 13, wherein forming the capping layer over the doping layer comprises in-situ forming a nitride layer having a thickness ranging from about 10 Å to about 25 Å.

17. The method of claim 12, further comprising forming a gate trench over a semiconductor fin by removing a dummy gate.

18. The method of claim 13, wherein forming the doping layer comprises transferring the metal gate structure from a chamber performing the formation of the grain boundary engineering layer to another chamber performing the formation of the doping layer under vacuum.

19. The method of claim 12, further comprising forming an etch stop over the high k dielectric layer.

20. The method of claim 19, wherein the etch stop comprises TiN or TaN with a thickness of from about 5 Å to about 30 Å.

* * * * *